United States Patent
Pascolini

(10) Patent No.: US 9,791,490 B2
(45) Date of Patent: Oct. 17, 2017

(54) ELECTRONIC DEVICE HAVING COUPLER FOR TAPPING ANTENNA SIGNALS

(71) Applicant: Apple Inc., Cupertino, CA (US)

(72) Inventor: Mattia Pascolini, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 388 days.

(21) Appl. No.: 14/299,844

(22) Filed: Jun. 9, 2014

(65) Prior Publication Data

US 2015/0355251 A1    Dec. 10, 2015

(51) Int. Cl.
G01R 29/10    (2006.01)
(52) U.S. Cl.
CPC .................... G01R 29/10 (2013.01)
(58) Field of Classification Search
CPC ........... G01R 29/10; H01Q 1/50; H01Q 3/267
USPC .................................. 343/703, 850
See application file for complete search history.

(56) References Cited

U.S. PATENT DOCUMENTS

| | | | |
|---|---|---|---|
| 5,172,064 A | 12/1992 | Walls | |
| 5,337,353 A | 8/1994 | Bole et al. | |
| 5,463,406 A | 10/1995 | Vannatta et al. | |
| 5,564,086 A | 10/1996 | Cygan et al. | |
| 5,650,597 A | 7/1997 | Redmayne | |
| 5,805,067 A | 9/1998 | Bradley et al. | |
| 5,826,458 A | 10/1998 | Little | |
| 5,854,972 A | 12/1998 | Pennock et al. | |
| 5,864,316 A | 1/1999 | Bradley et al. | |
| 5,905,467 A | 5/1999 | Narayanaswamy et al. | |
| 5,956,626 A | 9/1999 | Kaschke et al. | |

(Continued)

FOREIGN PATENT DOCUMENTS

| | | |
|---|---|---|
| CN | 1452414 | 10/2003 |
| CN | 1696743 | 11/2005 |

(Continued)

OTHER PUBLICATIONS

"CapTouch Programmable Controller for Single-Electrode Capacitance Sensors", AD7147 Data Sheet Rev. B, [online], Analog Devices, Inc., [retrieved on Dec. 7, 2009], <URL: http://www.analog.com/static/imported-files/data_sheets/AD7147.pdf>.

*Primary Examiner* — Dameon E Levi
*Assistant Examiner* — David Lotter
(74) *Attorney, Agent, or Firm* — Treyz Law Group, P.C.; G. Victor Treyz; Michael H. Lyons

(57) ABSTRACT

An electronic device may be provided with wireless circuitry. Control circuitry may be used to adjust transmit power levels for wireless signals, may be used to tune antennas, and may be used to adjust other settings for the wireless circuitry. The electronic device may have a coupler interposed between an antenna and wireless transceiver circuitry. The coupler and a receiver within the transceiver circuitry may be used to make measurements on tapped antenna signals such as transmitted signals and signals reflected from the antenna. By analyzing the tapped antenna signals, S-parameter phase and magnitude information may be gathered that provides insight into whether the electronic device is operating properly and whether an external object is adjacent to the antenna. If an external object is present, the electronic device may limit wireless transmit power and may adjust tunable components in the antenna to compensate for detuning from the external object.

19 Claims, 11 Drawing Sheets

(56) References Cited

U.S. PATENT DOCUMENTS

| | | | |
|---|---|---|---|
| 6,151,563 A | 11/2000 | Marinelli | |
| 6,285,893 B1 | 9/2001 | Keidnbou | |
| 6,329,958 B1 | 12/2001 | McLean et al. | |
| 6,380,899 B1 | 4/2002 | Madsen et al. | |
| 6,408,193 B1 | 6/2002 | Katagishi et al. | |
| 6,456,856 B1 | 9/2002 | Werling et al. | |
| 6,529,088 B2 | 3/2003 | Lafleur et al. | |
| 6,611,227 B1 | 8/2003 | Nebiyeloul-Kifle et al. | |
| 6,657,595 B1 | 12/2003 | Phillips et al. | |
| 6,678,532 B1 | 1/2004 | Mizoguchi | |
| 6,845,126 B2 | 1/2005 | Dent et al. | |
| 6,862,433 B2 | 3/2005 | Callaway | |
| 6,959,209 B2 | 10/2005 | Fang | |
| 6,978,121 B1 | 12/2005 | Lane et al. | |
| 6,985,113 B2 | 1/2006 | Nishimura et al. | |
| 7,016,686 B2 | 3/2006 | Spaling et al. | |
| 7,053,629 B2 | 5/2006 | Nevermann et al. | |
| 7,109,945 B2 | 9/2006 | Mori | |
| 7,113,087 B1 | 9/2006 | Casebolt | |
| 7,146,139 B2 | 12/2006 | Nevermann | |
| 7,181,251 B2 | 2/2007 | Stohr et al. | |
| 7,443,154 B1 | 10/2008 | Merewether et al. | |
| 7,486,386 B1 | 2/2009 | Holcombe et al. | |
| 7,499,722 B2 | 3/2009 | McDowell et al. | |
| 7,522,846 B1 | 4/2009 | Lewis et al. | |
| 7,633,076 B2 | 12/2009 | Huppi et al. | |
| 7,764,935 B2 | 7/2010 | Pallonen et al. | |
| 7,826,875 B2 | 11/2010 | Karaoguz et al. | |
| 7,834,813 B2 | 11/2010 | Caimi et al. | |
| 7,999,748 B2 | 8/2011 | Ligtenberg et al. | |
| 8,023,984 B2 | 9/2011 | Jin et al. | |
| 8,135,354 B2 | 3/2012 | Duron et al. | |
| 8,159,399 B2 | 4/2012 | Dorsey et al. | |
| 8,255,009 B2 | 8/2012 | Sorensen et al. | |
| 8,326,221 B2 | 12/2012 | Dorsey | |
| 8,417,296 B2 | 4/2013 | Caballero et al. | |
| 8,432,322 B2 | 4/2013 | Amm et al. | |
| 8,498,322 B2 | 7/2013 | Smiley | |
| 8,532,697 B2 | 9/2013 | Pascolini | |
| 8,629,719 B2 | 1/2014 | Destouches et al. | |
| 8,738,093 B1 | 5/2014 | Gopalakrishnan et al. | |
| 8,744,384 B2 | 6/2014 | Mendolia et al. | |
| 8,749,523 B2 | 6/2014 | Pance et al. | |
| 8,767,871 B2 | 7/2014 | Park et al. | |
| 8,768,273 B2 | 7/2014 | Rozenblit et al. | |
| 8,781,420 B2 | 7/2014 | Schlub et al. | |
| 8,792,930 B1 | 7/2014 | Gopalakrishnan et al. | |
| 8,818,450 B2 | 8/2014 | Caballero et al. | |
| 8,989,792 B1 | 3/2015 | Depew | |
| 9,088,953 B2 | 7/2015 | Bishop et al. | |
| 9,300,342 B2 | 3/2016 | Schlub et al. | |
| 2002/0027474 A1 | 3/2002 | Bonds | |
| 2002/0094789 A1 | 7/2002 | Harano | |
| 2002/0123309 A1 | 9/2002 | Collier et al. | |
| 2003/0062907 A1 | 4/2003 | Nevermann | |
| 2003/0064732 A1 | 4/2003 | McDowell et al. | |
| 2003/0064761 A1 | 4/2003 | Nevermann | |
| 2003/0114127 A1 | 6/2003 | Baldwon | |
| 2003/0186728 A1 | 10/2003 | Manjo | |
| 2003/0197597 A1 | 10/2003 | Bahl et al. | |
| 2003/0210203 A1* | 11/2003 | Phillips | H01Q 1/362 343/850 |
| 2003/0218993 A1 | 11/2003 | Moon et al. | |
| 2004/0167707 A1 | 8/2004 | Bragansa et al. | |
| 2004/0176083 A1 | 9/2004 | Shiao et al. | |
| 2004/0222926 A1 | 11/2004 | Kontogeorgakis et al. | |
| 2004/0229659 A1 | 11/2004 | Boos et al. | |
| 2005/0124305 A1 | 6/2005 | Stichelbout | |
| 2005/0157646 A1 | 7/2005 | Addagatla et al. | |
| 2005/0245204 A1 | 11/2005 | Vance | |
| 2005/0264304 A1 | 12/2005 | Nakamura et al. | |
| 2006/0046653 A1 | 3/2006 | Kirbas | |
| 2006/0161871 A1 | 7/2006 | Hotelling et al. | |
| 2006/0199602 A1 | 9/2006 | Zinn | |
| 2006/0205368 A1 | 9/2006 | Bustamante et al. | |
| 2006/0232468 A1 | 10/2006 | Parker et al. | |
| 2006/0244663 A1 | 11/2006 | Fleck et al. | |
| 2007/0103367 A1 | 5/2007 | Wang | |
| 2007/0188375 A1 | 8/2007 | Richards et al. | |
| 2008/0002626 A1 | 1/2008 | Yokoyama | |
| 2008/0165063 A1 | 7/2008 | Schlub et al. | |
| 2008/0165065 A1 | 7/2008 | Hill et al. | |
| 2008/0220831 A1 | 9/2008 | Alameh et al. | |
| 2008/0248837 A1 | 10/2008 | Kunkel | |
| 2009/0000023 A1 | 1/2009 | Wegelin et al. | |
| 2009/0096683 A1* | 4/2009 | Rosenblatt | H01Q 1/242 343/702 |
| 2009/0174611 A1 | 7/2009 | Schlub et al. | |
| 2009/0256759 A1 | 10/2009 | Hill et al. | |
| 2009/0295648 A1 | 12/2009 | Dorsey et al. | |
| 2009/0305742 A1 | 12/2009 | Caballero et al. | |
| 2009/0325511 A1 | 12/2009 | Kim | |
| 2010/0167672 A1 | 7/2010 | Ahn et al. | |
| 2010/0279686 A1 | 11/2010 | Tokgoz et al. | |
| 2011/0012793 A1 | 1/2011 | Amm et al. | |
| 2011/0012794 A1 | 1/2011 | Schlub et al. | |
| 2011/0012840 A1 | 1/2011 | Hotelling et al. | |
| 2011/0116404 A1 | 5/2011 | Shimizu | |
| 2011/0159920 A1 | 6/2011 | Lehmann | |
| 2011/0212746 A1 | 9/2011 | Sarkar et al. | |
| 2011/0215814 A1 | 9/2011 | Dorrough | |
| 2011/0250928 A1 | 10/2011 | Schlub et al. | |
| 2011/0313690 A1 | 12/2011 | Sato | |
| 2012/0021707 A1 | 1/2012 | Forrester et al. | |
| 2012/0021800 A1 | 1/2012 | Wilson et al. | |
| 2012/0071195 A1 | 3/2012 | Chakraborty et al. | |
| 2012/0098588 A1 | 4/2012 | Ujvari | |
| 2012/0112851 A1* | 5/2012 | Manssen | H03H 7/40 333/101 |
| 2012/0139776 A1 | 6/2012 | Malmqvist et al. | |
| 2012/0178386 A1 | 7/2012 | Pascolini et al. | |
| 2012/0196591 A1* | 8/2012 | O'Keeffe | H01Q 3/2605 455/427 |
| 2012/0206304 A1 | 8/2012 | Clow et al. | |
| 2012/0208554 A1 | 8/2012 | Won et al. | |
| 2012/0214412 A1 | 8/2012 | Schlub et al. | |
| 2012/0214422 A1 | 8/2012 | Shi et al. | |
| 2012/0231737 A1 | 9/2012 | Ponce De Leon et al. | |
| 2012/0239955 A1 | 9/2012 | Yanase et al. | |
| 2012/0257657 A1 | 10/2012 | Subrahmanya et al. | |
| 2012/0270519 A1 | 10/2012 | Ngai et al. | |
| 2012/0295554 A1* | 11/2012 | Greene | H04B 1/0458 455/77 |
| 2012/0309322 A1 | 12/2012 | Xu et al. | |
| 2013/0016632 A1 | 1/2013 | Mujtaba et al. | |
| 2013/0045700 A1 | 2/2013 | Stallman et al. | |
| 2013/0127670 A1 | 5/2013 | Desclos | |
| 2013/0142054 A1 | 6/2013 | Ahmadi | |
| 2013/0154897 A1* | 6/2013 | Sorensen | H01Q 7/005 343/861 |
| 2013/0156080 A1 | 6/2013 | Cheng et al. | |
| 2013/0169348 A1 | 7/2013 | Shi | |
| 2013/0210477 A1 | 8/2013 | Peter | |
| 2013/0217342 A1 | 8/2013 | Abdul-Gaffoor et al. | |
| 2013/0257667 A1* | 10/2013 | Kang | H01Q 1/243 343/749 |
| 2013/0315076 A1* | 11/2013 | Zhao | H04B 7/082 370/252 |
| 2013/0331042 A1* | 12/2013 | See | H04B 17/12 455/77 |
| 2014/0024321 A1 | 1/2014 | Zhu et al. | |
| 2014/0094229 A1 | 4/2014 | Mishima | |
| 2014/0126440 A1 | 5/2014 | Frank et al. | |
| 2014/0148211 A1 | 5/2014 | Mountford et al. | |
| 2014/0200003 A1 | 7/2014 | Kodali et al. | |
| 2014/0328488 A1 | 11/2014 | Caballero et al. | |
| 2015/0011236 A1 | 1/2015 | Kazmi et al. | |

FOREIGN PATENT DOCUMENTS

| | | |
|---|---|---|
| CN | 101053170 | 10/2007 |
| CN | 102325339 | 8/2014 |
| DE | 102005035935 | 2/2007 |

(56) References Cited

FOREIGN PATENT DOCUMENTS

| | | |
|---|---|---|
| EP | 0 564 164 | 10/1993 |
| EP | 1298809 | 4/2003 |
| EP | 1 469 550 | 10/2004 |
| EP | 1524774 | 4/2005 |
| EP | 1564896 | 8/2005 |
| EP | 2509229 | 10/2012 |
| GB | 2 380 359 | 4/2003 |
| JP | 2003179670 | 6/2003 |
| JP | 2003209483 | 7/2003 |
| JP | 2003216318 | 7/2003 |
| JP | 2004179995 | 6/2004 |
| JP | 2008009759 | 1/2008 |
| JP | 2008011292 | 1/2008 |
| JP | 2008017432 | 1/2008 |
| JP | 2008050943 | 3/2008 |
| JP | 2009032570 | 2/2009 |
| TW | 201235671 | 9/2012 |
| WO | 0131733 | 5/2001 |
| WO | 02/05443 | 1/2002 |
| WO | 2005112280 | 11/2005 |
| WO | 2006051363 | 5/2006 |
| WO | 2008078142 | 7/2008 |
| WO | 2009149023 | 12/2009 |
| WO | 2011023933 | 3/2011 |
| WO | 2012066559 | 5/2012 |

\* cited by examiner

| PHASE AND MAGNITUDE FEEDBACK | TRANSMIT POWER | ANTENNA TUNING |
| --- | --- | --- |
| NORMAL | NORMAL | NORMAL |
| SMALL MAGNITUDE MISMATCH, LARGE PHASE MISMATCH | REDUCED MAXIMUM TRANSMIT POWER | NORMAL |
| LARGE MAGNITUDE MISMATCH, LARGE PHASE MISMATCH | REDUCED MAXIMUM TRANSMIT POWER | TUNE ANTENNA TO COMPENSATE FOR DETUNING CAUSED BY OBJECT IN VICINITY OF ANTENNA |

*FIG. 8*

ELECTRONIC DEVICE HAVING COUPLER FOR TAPPING ANTENNA SIGNALS

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

It can be challenging to assemble and operate wireless electronic devices. During assembly, it may be difficult to determine whether assembly operations have been performed correctly. If care is not taken, antennas may not be properly interconnected with other portions of a device. Calibration steps may require the extensive use of test equipment and may take more time than desired. During operation of a wireless device by a user, wireless performance can be affected by changes in the environment of the wireless device.

It would therefore be desirable to be able to provide improved ways for characterizing the operation of wireless devices in various operating environments.

SUMMARY

An electronic device may be provided with wireless circuitry for transmitting and receiving wireless signals. Control circuitry may be used to adjust transmit power levels for the wireless signals, may be used to tune antennas, and may be used to adjust other settings for the wireless circuitry.

The electronic device may have one or more antennas. A coupler may be interposed between an antenna and wireless transceiver circuitry. Switching circuitry in the coupler may be used to allow the coupler to sample signals flowing from the transceiver circuitry and the antenna and to sample signals flowing from the antenna to the transceiver circuitry.

Using the coupler and using a receiver within the transceiver circuitry, a processor such as a baseband processor integrated circuit may make measurements on tapped antenna signals such as transmitted signals and signals reflected from the antenna. By analyzing the tapped antenna signals, S-parameter phase and magnitude information may be gathered that provides insight into whether the electronic device is operating properly and whether an external object is adjacent to the antenna. If an external object is present, the electronic device may limit wireless transmit power and may adjust tunable components in the antenna to compensate for detuning from the external object. The tapped antenna signals may be used in calibrating the wireless circuitry and may be used as part of a self-test routine.

BRIEF DESCRIPTION OF THE DRAWINGS

FIG. 8 is a table showing illustrative measured antenna feedback values and associated operating modes for an electronic device in accordance with an embodiment.

DETAILED DESCRIPTION

Figure 1:
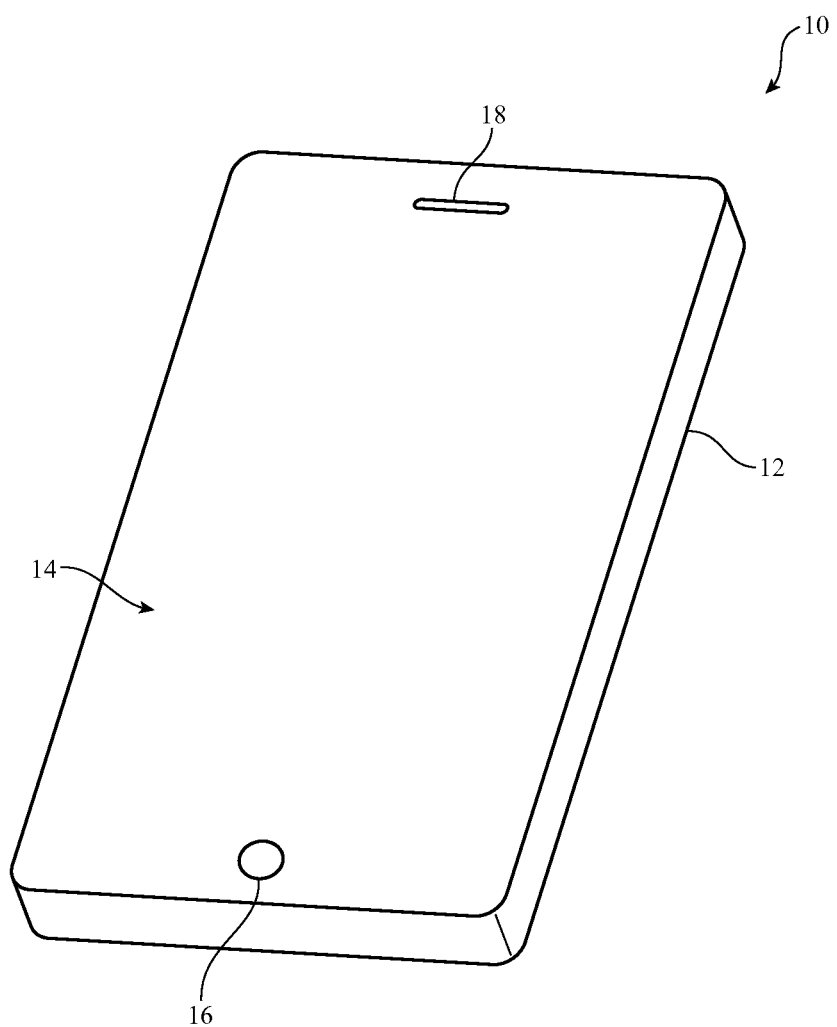
FIG. 1 is a perspective view of an illustrative electronic device with wireless communications circuitry in accordance with an embodiment.

An electronic device such as electronic device 10 of FIG. 1 may contain wireless circuitry. A coupler may be used to tap into a path between a radio-frequency transceiver and an associated antenna. The output from the tap can be used to measure antenna signals being transmitted to the antenna and antenna signals being reflected from the antenna. Processing circuitry within the electronic device may process the tapped antenna signals to produce phase and magnitude information (e.g., the phase and magnitude of an S-parameter such as S11, where network port 1 corresponds to the antenna port for the antenna, the phase and magnitude of antenna impedance, etc.). The phase and magnitude information can be used in evaluating device operation during testing, can be used during calibration operations, and can be used in real-time control of wireless circuitry in a device.

Device 10 may contain wireless communications circuitry that operates in long-range communications bands such as cellular telephone bands and wireless circuitry that operates in short-range communications bands such as the 2.4 GHz Bluetooth® band and the 2.4 GHz and 5 GHz WiFi® wireless local area network bands (sometimes referred to as IEEE 802.11 bands or wireless local area network communications bands). Device 10 may also contain wireless communications circuitry for implementing near-field communications, light-based wireless communications, satellite navigation system communications, or other wireless communications.

Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18. Openings may be formed in housing 12 to form communications ports (e.g., an audio jack port, a digital data port, etc.).

Figure 2:
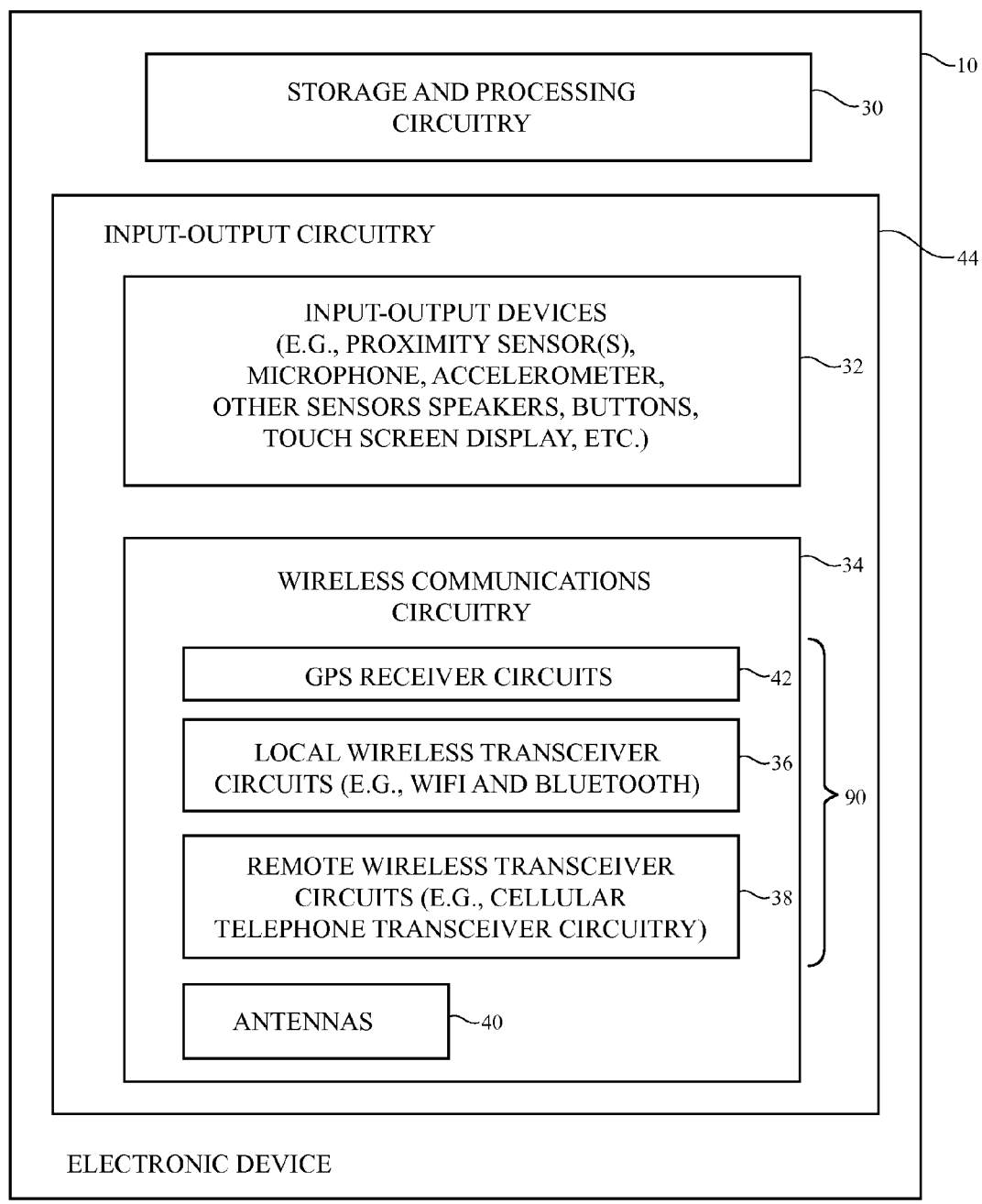
FIG. 2 is a schematic diagram of an illustrative electronic device with wireless communications circuitry in accordance with an embodiment.

A schematic diagram showing illustrative components that may be used in device 10 is shown in FIG. 2. As shown in FIG. 2, device 10 may include control circuitry such as storage and processing circuitry 30. Storage and processing circuitry 30 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 30 may be used to control the operation of device 10. This processing circuitry may be based on one or more microprocessors, microcontrollers, digital signal processors, baseband processor integrated circuits, application specific integrated circuits, etc.

Storage and processing circuitry 30 may be used to run software on device 10, such as internet browsing applications, voice-over-internet-protocol (VOIP) telephone call applications, email applications, media playback applications, operating system functions, etc. To support interactions with external equipment, storage and processing circuitry 30 may be used in implementing communications protocols. Communications protocols that may be implemented using storage and processing circuitry 30 include internet protocols, wireless local area network protocols (e.g., IEEE 802.11 protocols—sometimes referred to as WiFi®), protocols for other short-range wireless communications links such as the Bluetooth® protocol, cellular telephone protocols, MIMO protocols, antenna diversity protocols, etc.

Device 10 may include input-output circuitry 44. Input-output circuitry 44 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors (e.g., a capacitive proximity sensor and/or an infrared proximity sensor), magnetic sensors, connector port sensors that determine whether a connector such as an audio jack and/or digital data connector have been inserted in a connector port in device 10, a connector port sensor or other sensor that determines whether device 10 is mounted in a dock, other sensors for determining whether device 10 is coupled to an accessory, and other sensors and input-output components.

Input-output circuitry 44 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42.

Transceiver circuitry 36 may be wireless local area network transceiver circuitry that may handle 2.4 GHz and 5 GHz bands for WiFi® (IEEE 802.11) communications and that may handle the 2.4 GHz Bluetooth® communications band.

Circuitry 34 may use cellular telephone transceiver circuitry 38 for handling wireless communications in frequency ranges such as a low communications band from 700 to 960 MHz, a midband from 1710 to 2170 MHz, and a high band from 2300 to 2700 MHz or other communications bands between 700 MHz and 2700 MHz or other suitable frequencies (as examples). Circuitry 38 may handle voice data and non-voice data.

Wireless communications circuitry 34 can include circuitry for other short-range and long-range wireless links if desired. For example, wireless communications circuitry 34 may include 60 GHz transceiver circuitry, circuitry for receiving television and radio signals, paging system transceivers, near field communications (NFC) circuitry, etc.

Wireless communications circuitry 34 may include satellite navigation system circuitry such as global positioning system (GPS) receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, hybrids of these designs, etc. If desired, one or more of antennas 40 may be cavity-backed antennas. Different types of antennas may be used for different bands and combinations of bands. For example, one type of antenna may be used in forming a local wireless link antenna and another type of antenna may be used in forming a remote wireless link antenna.

Transmission line paths may be used to couple antenna structures 40 to transceiver circuitry 90. Transmission lines in device 10 may include coaxial cable paths, microstrip transmission lines, stripline transmission lines, edge-coupled microstrip transmission lines, edge-coupled stripline transmission lines, transmission lines formed from combinations of transmission lines of these types, etc. Filter circuitry, switching circuitry, impedance matching circuitry, and other circuitry may be interposed within the transmission lines, if desired.

Device 10 may contain multiple antennas 40. One or more of the antennas may be blocked by a user's body or other external object while one or more other antennas are not blocked. If desired, control circuitry 30 may be used to select an optimum antenna to use in device 10 in real time (e.g., an optimum antenna to transmit signals, etc.). Control circuitry 30 may, for example, make an antenna selection based on information on received signal strength, based on sensor data (e.g., information from a proximity sensor indicating which of multiple antennas may be blocked by an external object), based on tapped antenna signals from a coupler (e.g., phase and/or magnitude information), or based on other information.

Figure 3:
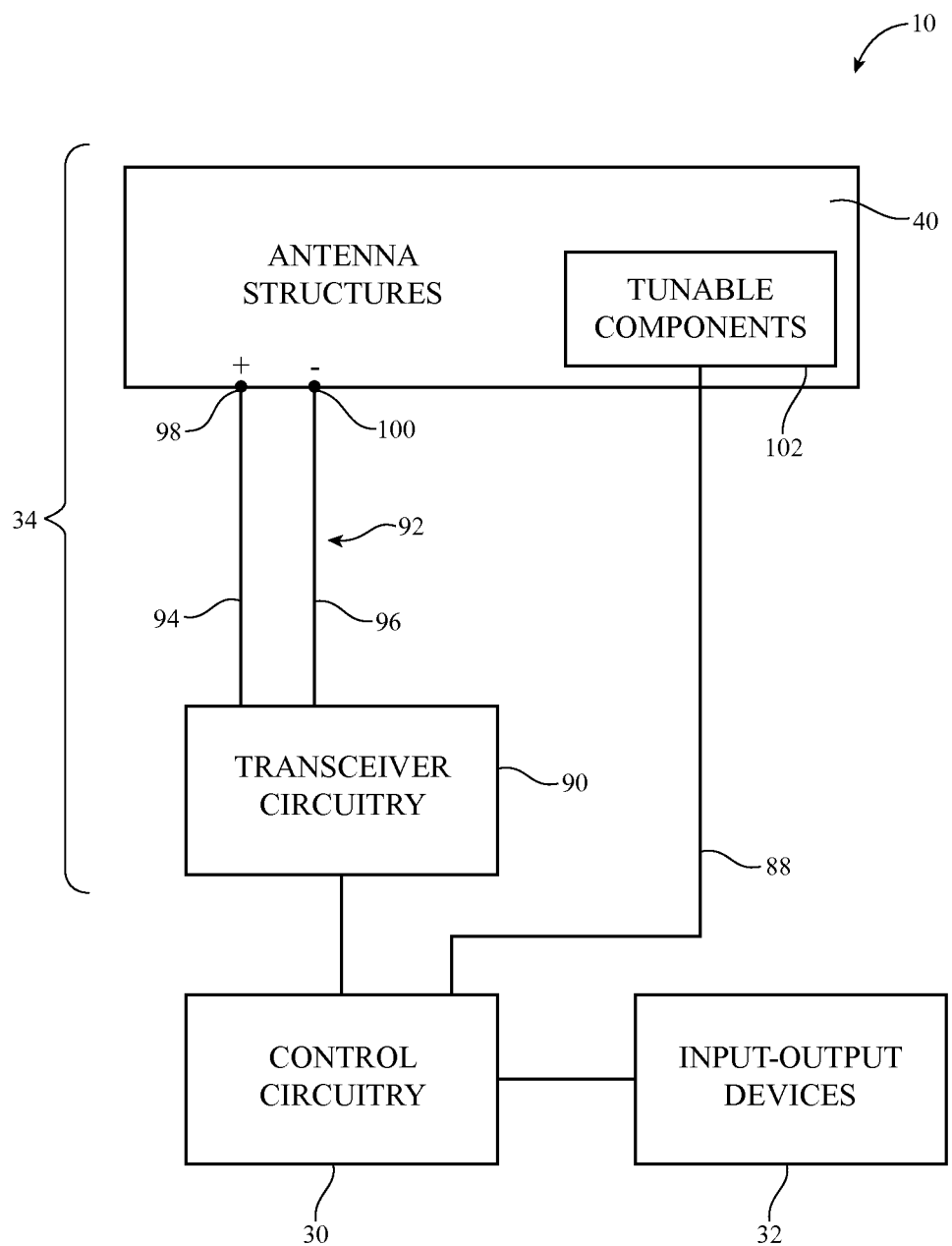
FIG. 3 is a diagram of illustrative wireless circuitry in accordance with an embodiment.

As shown in FIG. 3, transceiver circuitry 90 in wireless circuitry 34 may be coupled to antenna structures 40 using paths such as path 92. Wireless circuitry 34 may be coupled to control circuitry 30. Control circuitry 30 may be coupled to input-output devices 32. Input-output devices 32 may supply output from device 10 and may receive input from sources that are external to device 10.

To provide antenna structures 40 with the ability to cover communications frequencies of interest, antenna structures 40 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna structures 40 may be provided with adjustable circuits such as tunable components 102 to tune antennas over communications bands of interest. Tunable components 102 may include tunable inductors, tunable capacitors, or other tunable components. Tunable components such as these may be based on switches and networks of fixed components, distributed metal structures that produce associated distributed capacitances and inductances, variable solid state devices for producing variable capacitance and inductance values, tunable filters, or other suitable tunable structures. During operation of device 10, control circuitry 30 may issue control signals on one or more paths such as path 88 that adjust inductance values, capacitance values, or other parameters associated with tunable components 102, thereby tuning antenna structures 40 to cover desired communications bands.

Path 92 may include one or more transmission lines. As an example, signal path 92 of FIG. 3 may be a transmission line having a positive signal conductor such as line 94 and a ground signal conductor such as line 96. Lines 94 and 96 may form parts of a coaxial cable or a microstrip transmission line (as examples). A matching network formed from components such as inductors, resistors, and capacitors may be used in matching the impedance of antenna structures 40 to the impedance of transmission line 92. Matching network components may be provided as discrete components (e.g., surface mount technology components) or may be formed from housing structures, printed circuit board structures, traces on plastic supports, etc. Components such as these may also be used in forming filter circuitry in antenna structures 40.

Transmission line 92 may be coupled to antenna feed structures associated with antenna structures 40. As an example, antenna structures 40 may form an inverted-F antenna, a slot antenna, a hybrid inverted-F slot antenna or other antenna having an antenna feed with a positive antenna feed terminal such as terminal 98 and a ground antenna feed terminal such as ground antenna feed terminal 100. Positive transmission line conductor 94 may be coupled to positive antenna feed terminal 98 and ground transmission line conductor 96 may be coupled to ground antenna feed terminal 92. Other types of antenna feed arrangements may be used if desired. The illustrative feeding configuration of FIG. 3 is merely illustrative.

Figure 4:
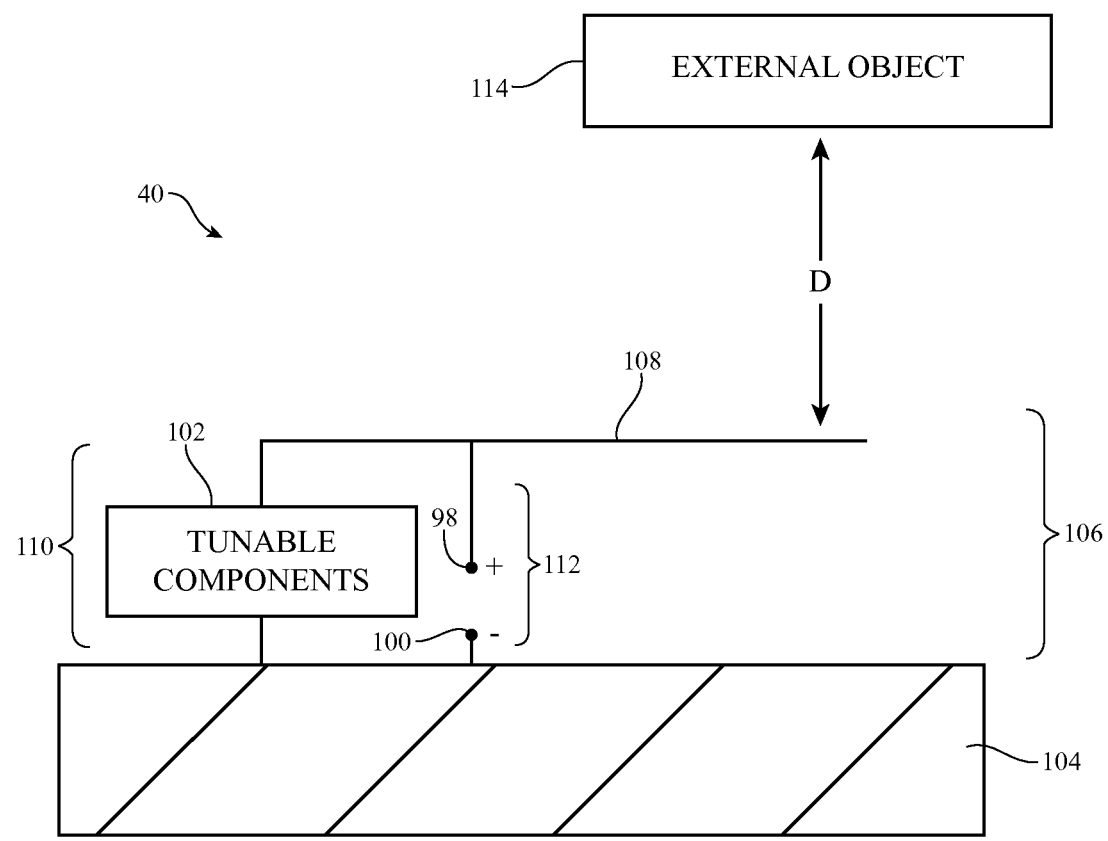
FIG. 4 is a diagram of an illustrative antenna of the type that may be influenced by the presence of an external object in the vicinity of the antenna in accordance with an embodiment.

FIG. 4 is a diagram of illustrative inverted-F antenna structures that may be used in implementing antenna 40 for device 10. Inverted-F antenna 40 of FIG. 4 has antenna resonating element 106 and antenna ground (ground plane) 104. Antenna resonating element 106 may have a main resonating element arm such as arm 108. The length of arm 108 may be selected so that antenna 40 resonates at desired operating frequencies. For example, if the length of arm 108 may be a quarter of a wavelength at a desired operating frequency for antenna 40. Antenna 40 may also exhibit resonances at harmonic frequencies.

Main resonating element arm 108 may be coupled to ground 104 by return path 110. Tunable component(s) 102 (e.g., an adjustable inductor, an adjustable capacitor, and/or other adjustable component) may be interposed in path 110 or may be incorporated elsewhere in antenna 40. Antenna feed 112 may include positive antenna feed terminal 98 and ground antenna feed terminal 100 and may run parallel to return path 110 between arm 108 and ground 104. If desired, inverted-F antennas such as illustrative antenna 40 of FIG. 4 may have more than one resonating arm branch (e.g., to create multiple frequency resonances to support operations in multiple communications bands) or may have other antenna structures (e.g., parasitic antenna resonating elements, tunable components to support antenna tuning, etc.).

Antennas such as antenna 40 of FIG. 4 may be affected by the presence of nearby objects. For example, an antenna may exhibit an expected frequency response when device 10 is operated in free space in the absence of nearby external objects such as external object 114, but may exhibit a different frequency response when device 10 is operated in the presence of external object 114. The magnitude of the distance between external object 114 and antenna 40 may also influence antenna performance.

External objects such as object 114 may include a user's body (e.g., a user's head, a user's leg, or other user body part), may include a table or other surface on which device 10 is resting, may include dielectric objects, may include conductive objects, and/or may include other objects that affect wireless performance (e.g., by loading antenna 40 in device 10 and thereby affecting antenna impedance for antenna 40).

When an external object such as object 114 is brought into the vicinity of antenna 40 (e.g., when object 114 is within 10 cm of antenna 40, when object 114 is within 1 cm of antenna 40, when object 114 is within 1 mm of antenna 40, or when distance D between antenna 40 and object 114 has other suitable values), antenna 40 may exhibit an altered frequency response (e.g., antenna 40 may be detuned because the impedance of the antenna has been changed due to loading from object 114). Using phase and magnitude information from tapped antenna signals, device 10 (e.g., processor 30) may control the operation of wireless circuitry 34 accordingly. For example, when it is determined from tapped antenna signals that antenna 40 has been detuned due to the presence of external object 114, tunable components 102 may be adjusted to compensate for the detuning. As another example, if it is determined that an external object such as a user's body is present, the maximum transmit power that is used by device 10 in transmitting signals through antenna 40 can be reduced.

Figure 5:
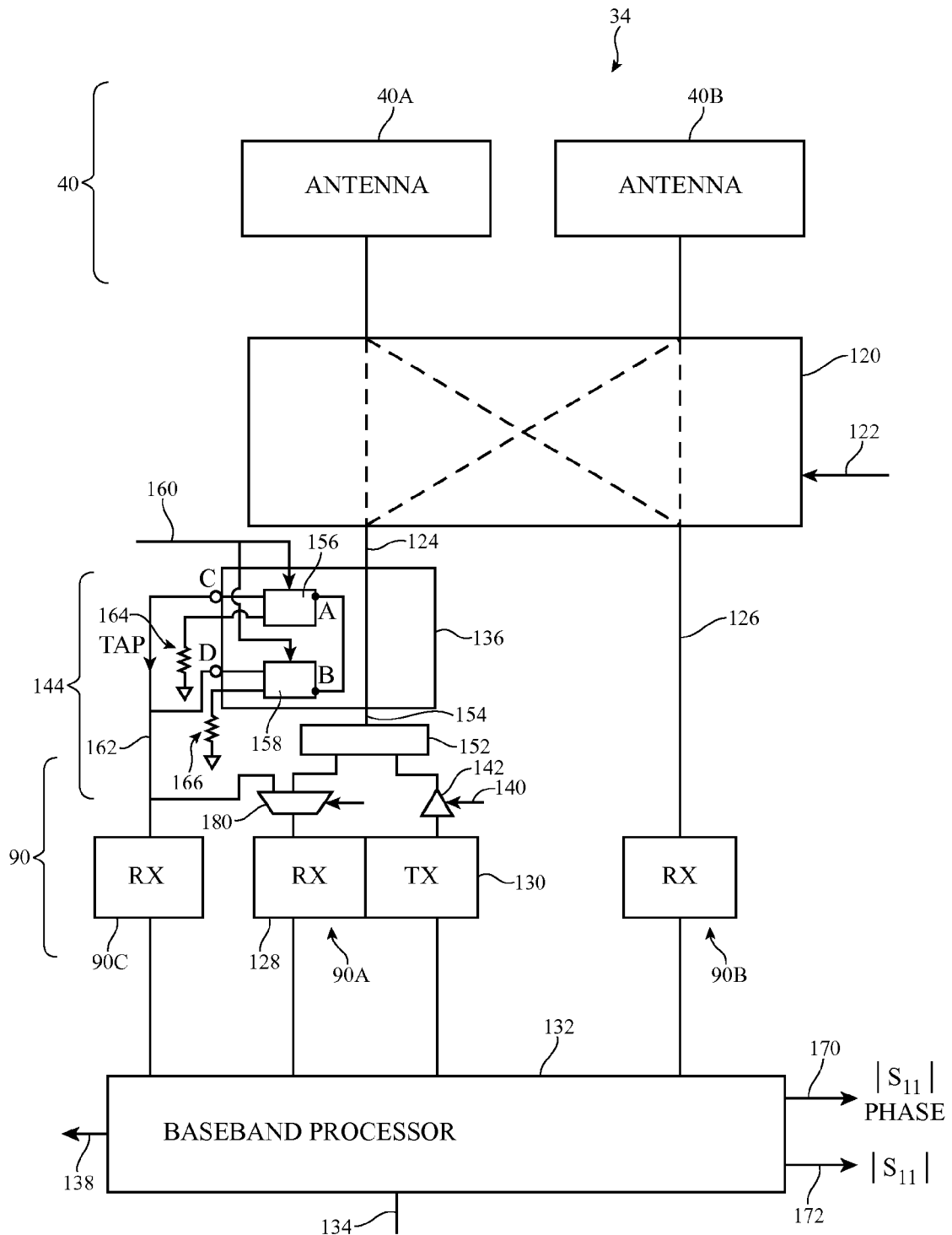
FIG. 5 is a circuit diagram of illustrative circuitry that may be used to gather tapped antenna signals in accordance with an embodiment.

FIG. 5 is a diagram of illustrative wireless circuitry based on multiple antennas 40. As shown in FIG. 5, antennas 40 may include a first antenna such as antenna 40A and a second antenna such as antenna 40B. Antennas 40 may be coupled to transceiver circuitry 90 and other circuitry such as baseband processor 132. Transceiver circuitry 90 may include receivers and/or transmitters. For example, transceiver circuitry 90 may include a first transceiver such as transceiver 90A (e.g., receiver 128 and transmitter 130, which may be coupled to path 124 via duplexer 152 or other circuitry), a second transceiver such as transceiver 90B (e.g., a receiver), and a third transceiver such as transceiver 90C (e.g., a receiver).

Circuitry 144 may be interposed between path 124 and transceiver circuitry 90. Paths 124 and path 126 may be coupled to antennas 40A and 40B using switching circuitry 120. Switching circuitry 120 may be, for example, a double-pole-double-throw switch that is controlled by control signals at switch control input 122. In a first state, switch 120 couples antenna 40A to path 124 and couples antenna 40B to path 126. In a second state, switch 120 couples antenna 40B to path 124 and couples antenna 40A to path 126.

Antennas 40A and 40B may be located at opposing upper and lower ends of electronic device 10 and housing 12 of FIG. 1 or may be located elsewhere in device 10. Control circuitry in device 10 may use received signal strength information, sensor information, and/or antenna feedback information (e.g., antenna impedance information) to determine whether switch 120 should be placed in the first state or the second state. For example, the lower antenna in device 10 may be used as a primary antenna to transmit and receive signals while the upper antenna in device 10 is used as a secondary antenna that only receives signals. When received signal strength with the lower antenna drops below a threshold amount or when other criteria are satisfied, the state of switch 120 may be changed so that the upper antenna is switched into use in place of the lower antenna (as an example).

Circuitry 144 may include coupler 136. Coupler 136 may be used to tap antenna signals flowing between transceiver circuitry 90 and antennas 40. Coupler 136 has internal terminals A and B and has external terminals C and D. Switching circuitry in coupler 136 can direct tapped signals to terminals C and D. Terminals C and D are coupled to tapped antenna signal path 162. Path 162 may be coupled to a receiver in transceiver circuitry 90, so that tapped antenna signals can be measured and processed. In the example of FIG. 5, receiver 90C is being used to receive signals on path 162. If desired, switching circuitry (see, e.g., optional switch 180) or other circuitry may be used to route signals from path 162 to other receivers in transceiver circuitry 90 (see, e.g., receiver 128 and receiver 90B). The use of a dedicated receiver such as receiver 90C for receiving tapped antenna signals from path 162 is merely illustrative.

Using circuitry 144, antenna impedance information for the currently active antenna can be gathered. The impedance information may be gathered by gathering S-parameter information such as the phase and magnitude of $S_{11}$ (where network port 1 in this example is associated with the currently active antenna in antennas 40). For example, if antenna 40A is the currently active antenna associated with transmitter 130, transmitter 130 may transmit antenna signals to antenna 40A using output path 150, power amplifier 142, duplexer 152, and path 154. Coupler 136 may be used to route a tapped version of the transmitted signals and a tapped version of reflected signals from antenna 40A to path 162. Receiver 90C and baseband processor 132 can process these tapped signals to produce information on the phase of S11 at output 170 and the magnitude of S11 at output 172. Processor 132 may also retain this information internally. Processor 132 and/or other processing circuitry 30 in device 10 may take appropriate action based on the signal values at outputs 170 and/or 172 and may, if desired, further process these signal values (e.g., to produce real and imaginary antenna impedance information, etc.).

As shown in FIG. 5, coupler 136 may have switching circuitry such as switches 156 and 158. Control signals from baseband processor 132 (e.g., control signals from control output 138) or other control signals may be supplied to control path 160 to adjust the states of switches 156 and 158. Switch 156 may be directed to couple internal coupler terminal A to coupler output terminal C or to termination 164 (e.g., a 50 ohm ground termination). Switch 158 may be directed to couple internal coupler terminal B to coupler output terminal D or to termination 166 (e.g., a 50 ohm ground termination). When it is desired to measure transmitted antenna signals flowing from path 154 to path 124 through coupler 136, switch 158 is directed to short terminal B to terminal D while switch 156 connects terminal A to termination 164, so that receiver 90C measures a tapped version of the transmitted signal on path 162. When it is desired to measure received antenna signals flowing from path 124 to path 154 through coupler 136 (e.g., reflected signals from antenna 40A when antenna 40A is the active antenna), switch 156 is directed to short terminal A to terminal C while switch 158 connects terminal B to termination 166, so that receiver 90C measures the tapped version of the reflected signal on path 162. The magnitude of $S_{11}$ is given by the log of the reflected signal divided by the forward (transmitted) signal and is supplied by processor 132 to output 172. The phase of $S_{11}$ is supplied to output 170.

Baseband processor 132 may be an integrated circuit that is coupled to processing circuitry in device 10 via paths such as path 134. During normal operation, baseband processor 132 receives data to be transmitted from circuits in control circuitry 30 via path 134 and provides received data to circuits in control circuitry 30 via path 134. During antenna impedance data gathering operations, baseband processor 132 can use transceiver circuitry 90 and the other circuitry of FIG. 5 to extract real and imaginary antenna impedance information for antennas 40. For example, baseband processor 132 can use transceiver circuitry 90 and coupler 136 to gather phase and magnitude information for tapped antenna signals (e.g., $S_{11}$ phase and magnitude information). Based on this information and other information (e.g., received signal strength information, sensor data from a proximity sensor and other sensors, etc.), baseband processor 132 or other control circuitry in device may generate control signals (see, e.g., control signal output 138 of FIG. 5). The control signals may be used in tuning antenna 40A and/or 40B (e.g., by adjusting tunable components 102), may be used in switching one or more antennas into use (e.g., by supplying a control signal to a switch control input such as input 122 of double-pole-double-throw antenna switch 120), may be used in controlling output power from a transmitter in transceiver circuitry 90 such as transmitter 130, may be used in controlling output power by adjusting power amplifier gain with control signals applied to control input 140 of power amplifier 142, or may otherwise be used in controlling the operation of device 10. Information on paths 170 and 172 may also be used in taking other actions (e.g., issuing alerts, making pass/fail decisions during testing as part of a manufacturing process or in-store diagnostics routine being run on device 10, etc.).

Antenna impedance information gathered using coupler 136 and the other circuitry of FIG. 5 may be used to perform in-factory diagnostics, to perform in-store diagnostics (service center diagnostics), to calibrate the transmitter circuitry and/or other wireless circuitry in device 10, and to control the operation of device 10 in real time.

Consider, as an example, in-factory or in-store diagnostics. The proper functioning of the wireless circuitry of device 10 can be verified using antenna impedance data. If an antenna connector, a transmission line for an antenna, a circuit that is coupled to an antenna, or other circuit associated with handling antenna signals in device 10 is faulty, the antenna impedance data gathered using coupler 136 will be affected. Accordingly, phase and magnitude information of the type produced on outputs 170 and 172 may be used to check whether device 10 is functioning properly (e.g., whether cables and other signal paths are properly attached to each other within housing 12, whether transceiver circuitry and switches are functioning properly, whether antenna structures have been damaged or are operating satisfactorily, etc.).

As another example, consider real time operation of device 10. As described in connection with FIG. 4, the impedance of antenna 40 can be influenced by the operating environment of antenna 40. As an example, antenna 40 may function differently when operated in the absence of external objects than when operated in the vicinity of external object 114. Moreover, different types of external objects 114 (e.g., different parts of a user's body, inanimate objects, conductive structures, etc.) may affect antenna operation differently. To ensure that antenna 40 operates as desired, real time antenna impedance data (and/or related information such as the magnitude and phase of S11 at outputs 170 and 172) can be evaluated by processor 132 or other processing circuitry in device 10.

Figure 6:
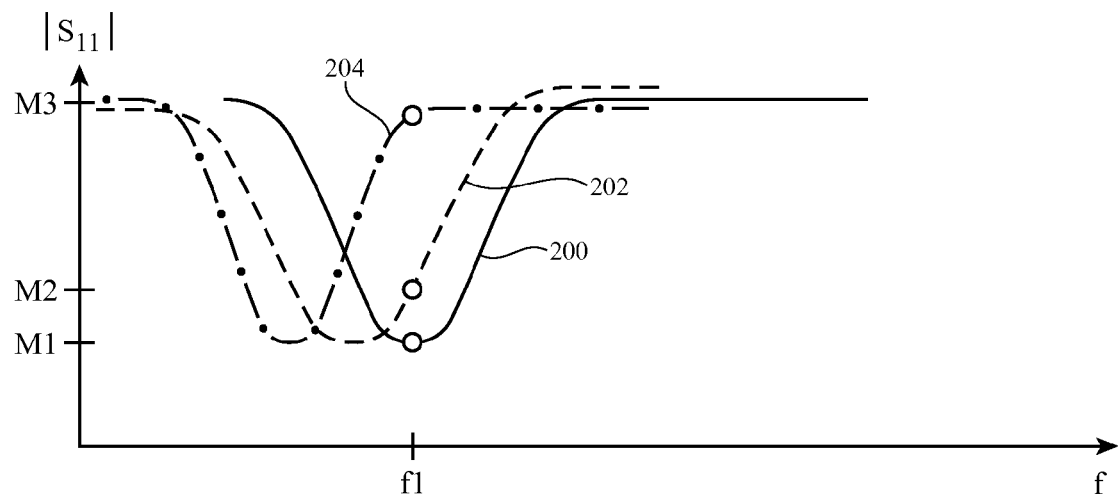
FIG. 6 is a graph in which the magnitude of an S-parameter associated with an antenna port has been plotted as a function of frequency in accordance with an embodiment.
Figure 7:
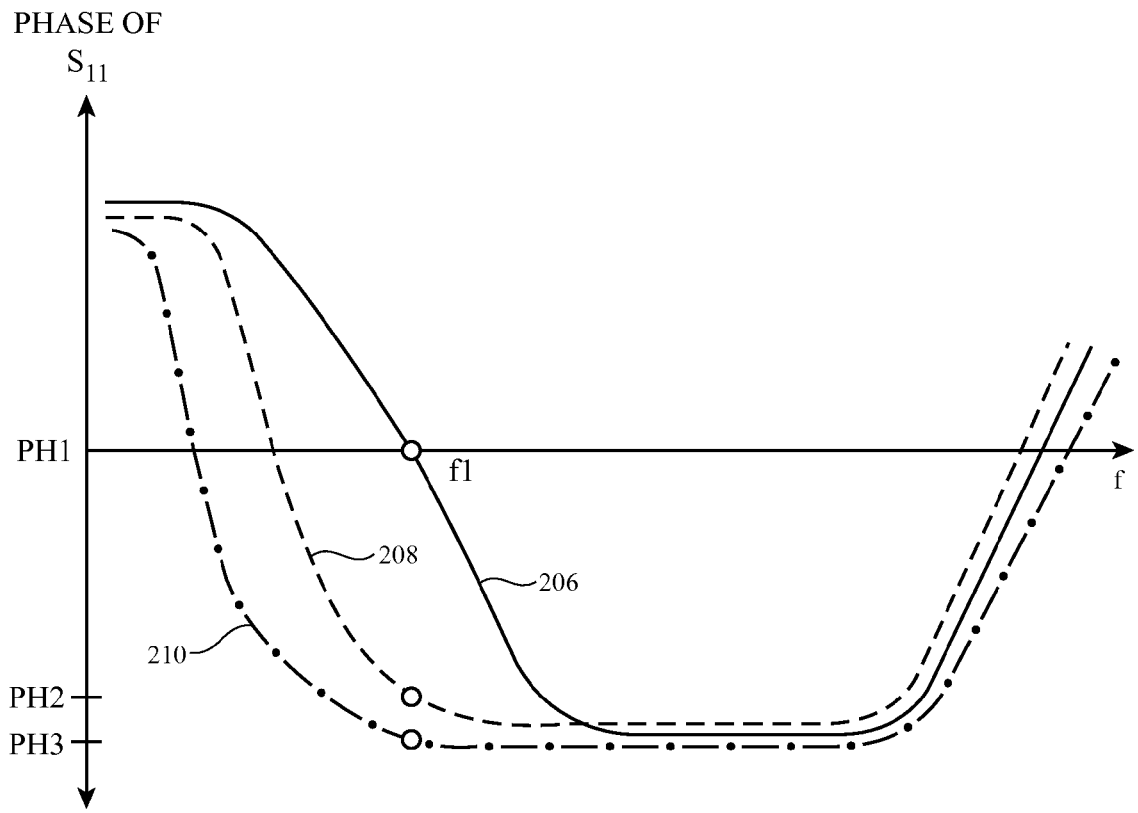
FIG. 7 is a graph in which the phase of the S-parameter has been plotted as a function of frequency in accordance with an embodiment.

FIGS. 6 and 7 are graphs of illustrative S11 magnitude and phase information from outputs 172 and 170, respectively. The data in these graphs illustrates the type of information that may be gathered when operating wireless circuitry 34 under various different operating conditions. In this example, curve 200 of FIG. 6 represents the magnitude of $S_{11}$ (output 172) during normal operation of antenna 40 in the absence of external object 114. Curve 206 represents the phase of $S_{11}$ (output 170) during normal operation of antenna 40 in the absence of external object 144. When object 114 (e.g., a part of a user's body) is at a first distance D (e.g., a distance of 5 cm) from antenna 40, the operation of antenna 40 is detuned due to loading from object 114, as shown by curve 202 of FIG. 6 and curve 208 of FIG. 7. In this case output 172 changes from M1 (normal operation; antenna is unloaded) to M2 (slightly loaded) and output 170 changes from PH1 (normal operation; antenna is unloaded) to PH2 (slightly loaded). When object 114 is at a second distance D (e.g., a distance of 1 mm), output 172 changes from M2 (slightly loaded) to M3 (heavily loaded) and output 170 changes from PH2 (slightly loaded) to PH3 (heavily loaded).

As shown in FIGS. 6 and 7, phase data tends to be more sensitive to loading from external objects than magnitude data, so PH2 changes significantly from PH1, whereas M2 does not change significantly from M1. Under heavy loading, however, M3 changes significantly from M2. By analyzing both phase and magnitude data, device 10 can accurately evaluate the current operating environment of device 10 (e.g., the loading of antenna 40) and can take corrective actions. Under slight loading conditions, antenna 40 may be only slightly detuned (see, e.g., the resonance of curve 202 in FIG. 6, which is shifted to a frequency that is only slightly below normal operating frequency band f1 of curve 200), so no corrective tuning of antenna 40 may be needed. Under heavy loading conditions, however, antenna 40 may become significantly detuned (as shown by curve 204 of FIG. 6), thereby requiring compensating tuning of tunable elements 102 in antenna 40. Once elements 102 are tuned, the frequency response to the antenna will return to normal curve 200.

In general, processing circuitry such as baseband processor 132 or other processing circuitry in device 10 may determine how severely antenna 40 has been affected by external object 114 and/or may deduce the nature of external object 114 using phase and magnitude information (e.g., to determine distance D of object 114 and/or to determine what part of a user's body is present in the vicinity of antenna 40 based on the loading characteristics of that body part and/or to determine whether external object 114 is associated with a user's body or is associated instead with an inanimate object such as a table). Sensor data (e.g., accelerometer data, audio data, proximity sensor data, etc.) and data on the current operating mode of device 10 (e.g., whether or not the ear speaker of device 10 is being actively used) may also be processed to provide additional information on the current operating environment of device 10 and the performance of antenna 40. Based on this information, the processing circuitry of device 10 can take suitable action. For example, the processing circuitry of device 10 may adjust antenna tuning, may set appropriate maximum transmit power values to establish appropriate transmit power limits, may perform antenna switching, etc.

FIG. 8 is a table illustrating how device 10 may operate under three different operating scenarios. In the scenario illustrated in the first row of the table of FIG. 8, the phase and magnitude data from outputs 170 and 174 is normal, so device 10 operates antenna 40 and transceiver circuitry 90 normally. The tuning of tunable components 102 is set to its normal state and the transmit power from transmitter 130 and power amplifier 142 is not restricted. Transmit power may be increased or decreased based on received instructions (transmit power commands) from a wireless base station and need not be limited due to the presence of an external object in the vicinity of device 10.

In the scenario illustrated in the second row of the table of FIG. 8, the measured phase signal on output 170 has changed from PH1 to PH2 and the measured magnitude signal on output 172 has changed from M1 to M2. Under these conditions (large phase mismatch and small magnitude mismatch), processor 132 can conclude that external object 114 is within a first distance D1 of antenna 40. As a result, the processor can reduce the maximum permitted output power from antenna 40 to ensure that regulatory limits on transmitted power are satisfied. Antenna 40 will not be significantly detuned by the presence of object 114, so no tuning adjustments are made to antenna 40.

In the scenario illustrated in the third row of the table of FIG. 8, both the phase and magnitude are significantly mismatched, so device 10 can conclude that external object 114 is within a second distance D2 that is smaller than D1. Device 10 can also conclude that antenna 40 will be detuned significantly from its desired operating state unless compensating adjustments are made. As a result, processor 132 may limit the maximum transmit power from antenna 40 (e.g., a maximum power level may be established that is lower than the maximum power permitted during operation in the scenario of the second row of the FIG. 8 table) and may adjust tunable antenna components 102 to compensate antenna 40 for the antenna detuning that would otherwise be experienced by antenna 40. As an example, if detuning results in a lowered resonant frequency for antenna 40 as illustrated by detuned curve 204 of FIG. 6, components 102 may be adjusted to raise the resonant frequency of antenna 40 back to the position of curve 200 (e.g., by adjusting an adjustable inductor in return path 110 to a lower inductor value).

Figure 9:
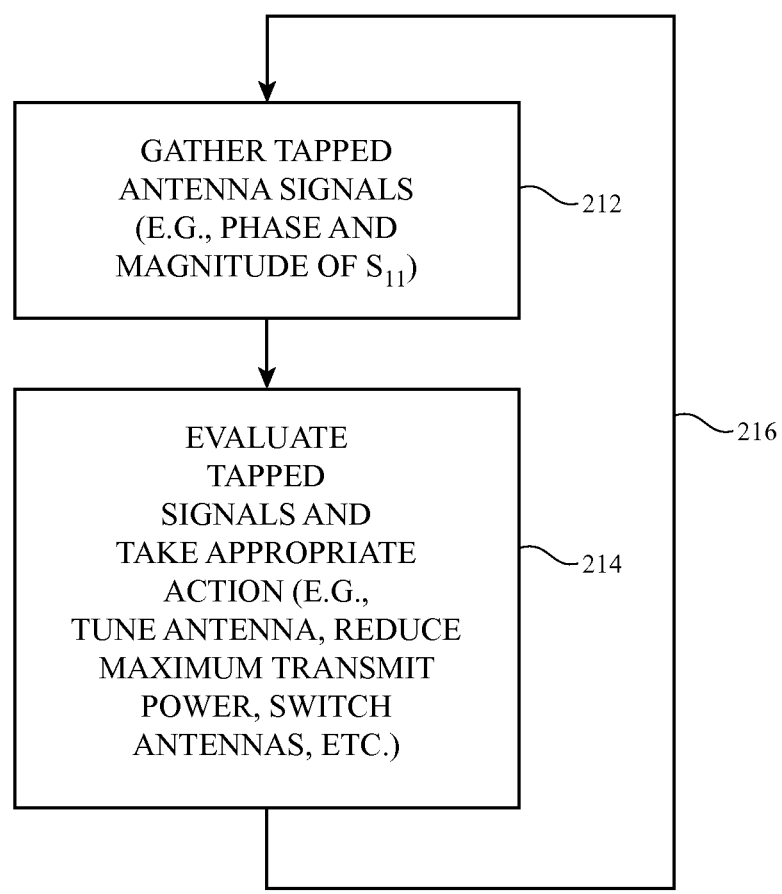
FIG. 9 is a flow chart of illustrative steps involved in gathering phase and magnitude information for antenna signals in a device and taking appropriate action during operation of the device in accordance with an embodiment.

Illustrative steps involved in performing these types of antenna evaluation and wireless circuit adjustment operations are shown in FIG. 9. During operation of device 10, a user may use wireless circuitry 34 to transmit and receive wireless signals. Using coupler 136, tapped antenna signals may be gathered. This allows processor 132 to produce real and imaginary impedance information (and/or related information such as $S_{11}$ phase and magnitude data) for the currently active antenna (step 212). During the operations of step 214, the gathered antenna data can be evaluated and suitable actions taken by device 10 in real time. For example, maximum transmit powers may be adjusted and antenna 40 may be tuned, as described in connection with FIG. 8. Processing may then loop back to step 212, as illustrated by line 216.

Figure 10:
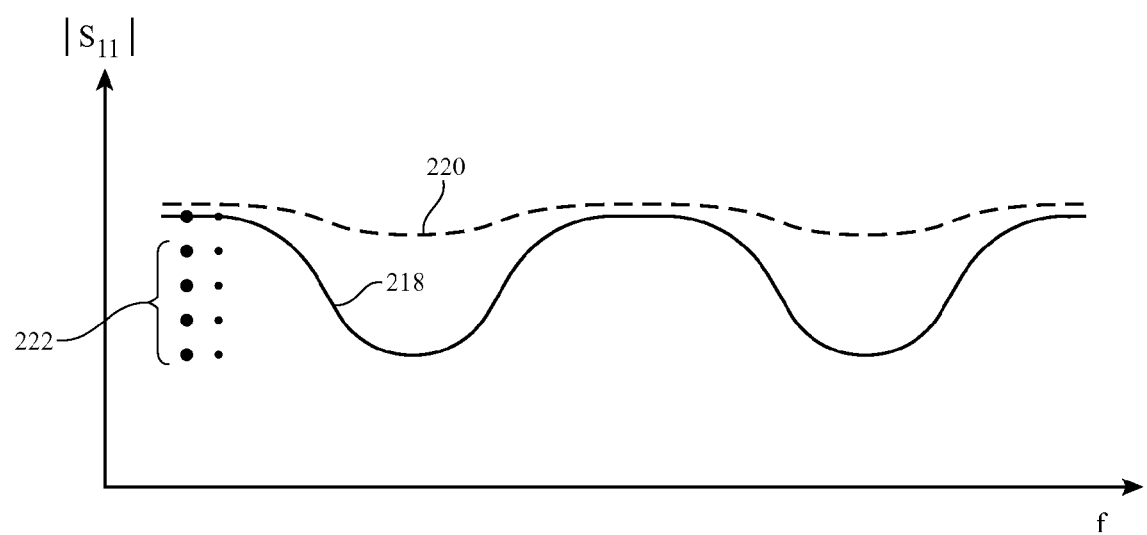
FIG. 10 is a graph showing how tapped antenna signals can be used in calibrating wireless circuitry in accordance with an embodiment.

FIG. 10 is a graph showing how gathered tapped antenna data (e.g., $S_{11}$ magnitude information in the example of FIG. 10) may be used during calibration operations and diagnostic operations. In the FIG. 10 example, curve 218 corresponds to a normal expected magnitude signal from output 172 covering a range of operating frequencies including low band frequencies around frequency f1 and high band frequencies. If wireless circuitry 34 contains a fault (e.g., a disconnected connector, a crack in an antenna trace or signal line trace, a loose solder joint in an antenna or antenna signal path, or other antenna-related failure that arises during manufacturing or during normal use of device 10), curve 218 will be affected and may exhibit a characteristic such as curve 220. During assembly of device 10 and/or during a diagnostics routine run by device 10 in a store or other service facility associated with the manufacturer of device 10 when device 10 is returned by the user for servicing, the presence of an abnormal antenna response curve such as curve 220 may be detected by processor 132 and appropriate action taken.

The graph of FIG. 10 shows how antenna measurements made using coupler 136 and processor 132 may also be used during calibration operations. As indicated by illustrative calibration measurements 222, wireless circuitry 24 may be calibrated by using coupler 136 to make a series of measurements at different frequencies and transmit powers. The results of these measurements may be gathered using coupler 136 and processor 132 (e.g., as $S_{11}$ magnitude information on output 172). To ensure calibration accuracy, coupler 136 can first be calibrated using an external power meter (e.g., a power meter plugged into a port in path 124 or other suitable antenna signal path). Following calibration of coupler 136, processor 132 can direct transmitter 130 to transmit signals over a range of output power levels (e.g., in 2 dB power increments) and output frequencies. At each different set of transmit power and frequency settings, a different corresponding tapped antenna signal can be captured using coupler 136. Although the entire calibration process may be time consuming (e.g., taking many minutes or even hours to complete), no external equipment (e.g., no external vector network analyzer) need be used to calibrate device 10 across all frequencies and power levels of interest. As a result of this ability to self-calibrate devices 10, numerous devices 10 can be calibrated in a factory in parallel without requiring the use of costly and complex test equipment.

Figure 11:
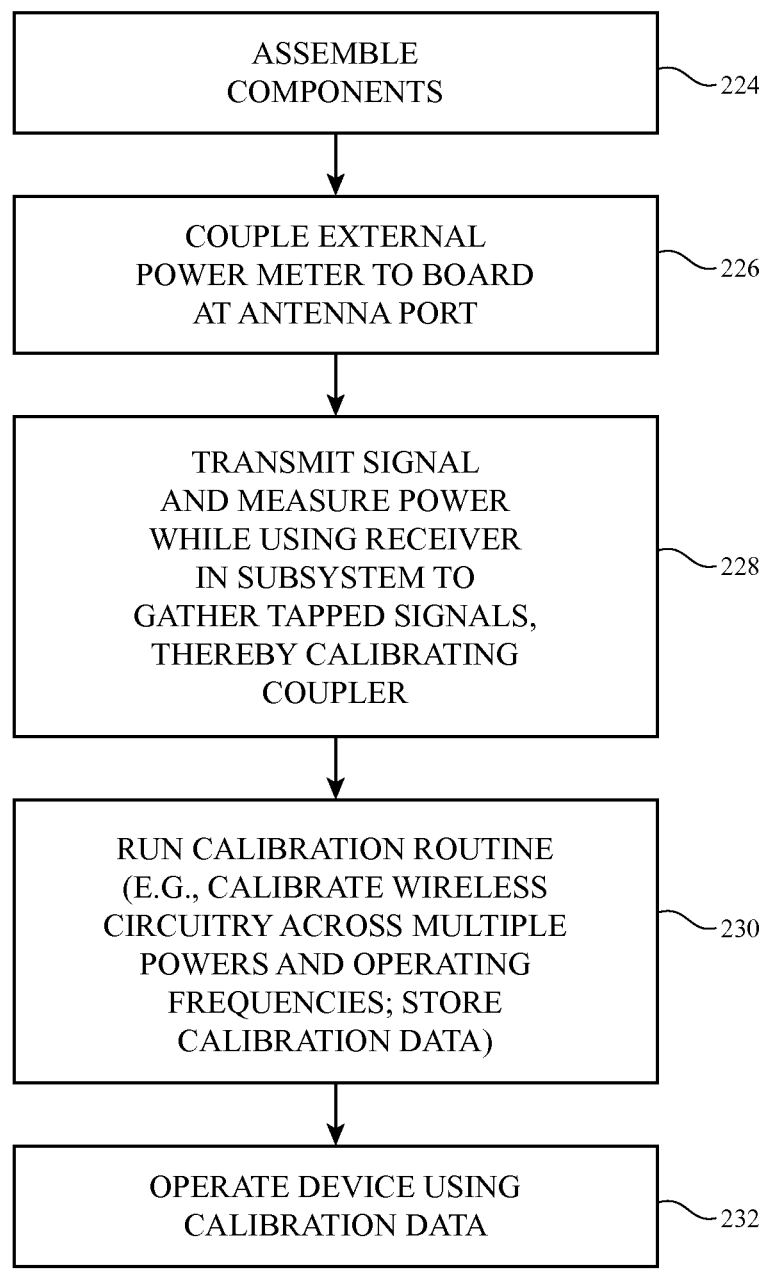
FIG. 11 is a flow chart of illustrative steps involved in using measurements of tapped antenna signals to calibrate wireless circuitry in an electronic device in accordance with an embodiment.

FIG. 11 is a flow chart of illustrative steps involved in calibrating device 10 in this way. At step 224, wireless circuit components for circuitry 34 may be assembled. For example, cables and other transmission line structures may be plugged into connectors, antenna structures may be fabricated, and, if desired, some or all of the rest of wireless circuitry 34 and device 10 can be assembled. Assembly operations may be performed at the device level (e.g., device 10 may be fabricated in its entirety) or at the board level (e.g., one or more printed circuits may be populated with antenna components, transceiver components, and other wireless circuitry 34 without completing the fabrication of device 10).

Following component assembly operations at step 224, an external power meter may, at step 226, be attached to an antenna port in device 10 (e.g., a port associated with antenna 40A). As an example, a power meter probe may be coupled to a connector adjacent to antenna 40A that momentarily disconnects antenna 40A while coupling the probe into the signal path between the antenna and transceiver.

While the power meter is attached, processor 132 may use transmitter 130 to transmit radio-frequency signals at a particular power level (step 228). The power meter captures the power and processor 132 uses coupler 136 to capture a tapped version of the transmitted power. By comparing the tapped signal reading to the power meter reading, coupler 136 may be calibrated.

Accordingly, at step 230, wireless circuitry 34 can be calibrated across numerous different operating frequencies and output power levels as part of a calibration routine that is run at step 230. As an example, an operator at a factory or other establishment may initiate a calibration routine that runs on processing circuitry 132 or other processing circuitry for device 10. The calibration routine may systematically alter the transmit frequency and transmit power of transmitter 130 while gathering tapped antenna signals using coupler 136 (e.g., magnitude information and, if desired, phase information). In this way, all desired frequencies may be calibrated (i.e., frequency-dependent variations may be determined) and power-dependent (non-linear) behaviors can be observed. The resulting calibration data for device 10 may be stored in storage in device 10 (see, e.g., storage and processing circuitry 30).

At step 232, device 10 can be used by a user to handle wireless communications. During normal operation, transmitter 130 can transmit power at calibrated levels using the calibration information stored in storage and processing circuitry 30.

Figure 12:
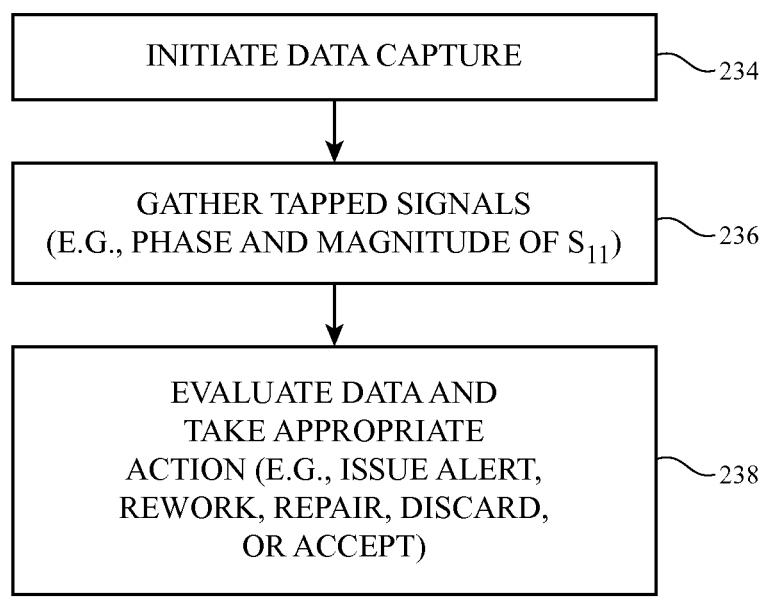
FIG. 12 is a flow chart of illustrative steps involved in using measurements of tapped antenna signals to evaluate whether a device is functioning properly in accordance with an embodiment.

In some situations, after some or all of device 10 has been assembled (step 224), faults may arise that can disrupt wireless operations. As an example, an antenna signal path may not be connected properly during initial device assembly operations or an antenna signal path may become loosened within device 10 during use (e.g., a cable connector or other antenna signal connector may become loose when device 10 is inadvertently dropped by a user). FIG. 12 is a flow chart of illustrative operations that may be performed to use phase and magnitude data from coupler 136 (e.g., phase signals on line 170 and/or magnitude signals on path 172) in running diagnostics on device 10 (whether fully or partly assembled).

At step 234 of FIG. 12, a data capture routine may be initiated. As an example, a data capture software program may be run on device 10 as part of a manufacturing diagnostic (e.g., a self-test routine initiated when manufacturing personnel select an on-screen option or when a wireless command or wired command is transmitted to device 10) or personnel in a service center may select an on-screen option on device 10 or may otherwise initiate a diagnostics routine.

At step 236, as part of the diagnostics routine running on device 10, processor 132 may use coupler 136 to gather phase and/or magnitude information for antenna 40 (e.g., impedance data). The captured data may reveal that device 10 is operating normally (see, e.g., normal antenna response curve 218) or may reveal that device 10 contains a fault (see, e.g., faulty antenna response curve 220).

At step 238, processor 132 may evaluate the captured data or, if desired, other circuitry in device 10 or ancillary external processing circuitry may evaluate the captured data. Appropriate action may then be taken based on the analyzed tapped antenna signal data. For example, if it is determined that device 10 is operating properly, processor 132 or other equipment may issue a visual message, an audible alert, or other message for personnel running the diagnostic test to indicate that device 10 has passed diagnostic testing. If it is determined that device 10 contains a fault, personnel associated with the diagnostic test may be informed the device 10 has failed testing and should be repaired, reworked, or discarded.

In some situations, diagnostic results will reveal that device 10 is not performing properly (e.g., because antenna characteristic 220 is detected instead of desired antenna characteristic 218), but it will not be possible to pinpoint the nature of the problem (e.g., the problem may be due either to a crack in a signal line or a crack in an antenna trace, but only visual inspection will reveal which of these two possible faults is present).

In other situations, the diagnostic routine running on device 10 can provide personnel associated with the test with more detailed test results. As an example, the shape of an antenna performance curve that is gathered may show that a particular antenna cable has been disconnected. Whenever device 10 is able to identify what type of problem that has been detected, an alert message may be displayed by control circuitry 30 on display 14 or other output may be provided that informs personnel running the diagnostic test of the nature of the test results. As an example, a message may be displayed on display 14 that contains repair instructions such as "replace wireless transceiver board" or "reconnect loose antenna flex" or that contains other detailed test results.

During manufacturing, it may be possible to rework faulty parts. In a repair center environment, a faulty part may require device 10 to be replaced or a more extensive repair may be made (e.g., by replacing a faulty printed circuit). Self-test diagnostic routines may, in general, be run in a factory setting or in a service-center setting or may be run by a user of device 10 (e.g., to determine whether device 10 requires servicing by authorized service personnel).

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
    an antenna;
    wireless radio-frequency transceiver circuitry that transmits radio-frequency signals at a transmit power level through the antenna;
    a coupler interposed in a path between the wireless radio-frequency transceiver circuitry and the antenna that taps, from the path, the radio-frequency signals transmitted by the wireless radio-frequency transceiver circuitry;
    a tapped signal path that carries the tapped radio-frequency signals from the coupler;
    a receiver in the wireless radio-frequency transceiver circuitry that receives the tapped radio-frequency signals from the tapped signal path and that measures the tapped radio-frequency signals; and
    a processor that processes the tapped radio-frequency signals to produce S-parameter phase and magnitude information, wherein the coupler comprises switching circuitry and the processor is configured to direct the switching circuitry to route the tapped radio-frequency signals to the tapped signal path.

2. The electronic device defined in claim 1, wherein the radio-frequency signals transmitted by the wireless radio-frequency transceiver circuitry reflect from the antenna, and the processor is configured to direct the switching circuitry to route a tapped version of the reflected transmitted radio-frequency signals to the tapped signal path.

3. The electronic device defined in claim 2 wherein the switching circuitry comprises a first switch and a second switch, and the first and second switches are controlled by the processor.

4. The electronic device defined in claim 3 wherein the first switch has a first terminal coupled to the tapped signal path, a second terminal coupled to a first ground termination, and a third terminal that receives the tapped version of the reflected transmitted radio-frequency signals.

5. The electronic device defined in claim 4 wherein the second switch has a first terminal coupled to the tapped signal path, a second terminal coupled to a second ground termination, and a third terminal that receives the tapped radio-frequency signals.

6. The electronic device defined in claim 5 further comprising a double-pole-double throw switch interposed between the antenna and the coupler.

7. The electronic device defined in claim 6 wherein the processor sets a maximum level for the transmit power level based on the phase and magnitude information.

8. The electronic device defined in claim 7 wherein the antenna comprises tunable components, and the processor adjusts the tunable components to tune the antenna based on the phase and magnitude information.

9. The electronic device defined in claim 1 wherein the antenna is detuned due to an external object in the vicinity of the antenna, the antenna comprises tunable components, and the processor adjusts the tunable components based on the phase and magnitude information to compensate for the detuning due to the external object.

10. The electronic device defined in claim 2, wherein the processor is configured to generate the S-parameter phase and magnitude information based on the tapped radio-frequency signals transmitted by the wireless radio-frequency transceiver circuitry and based on the tapped version of the reflected transmitted radio-frequency signals.

11. The electronic device defined in claim 10, wherein the S-parameter phase and magnitude information comprises an S-parameter value computed by the processor as a logarithm of the tapped version of the reflected transmitted radio-frequency signals divided by the tapped radio-frequency signals transmitted by the wireless radio-frequency transceiver circuitry.

12. The electronic device defined in claim 3, wherein the first switch is configured to route the tapped version of the reflected transmitted radio-frequency signals to the tapped signal path and the second switch is configured to route the tapped radio-frequency signals transmitted by the wireless radio-frequency transceiver circuitry to the tapped signal path.

13. The electronic device defined in claim 1, wherein the processor comprises a baseband processor that generates the S-parameter phase and magnitude information based on the tapped radio-frequency signals carried by the tapped antenna path.

14. The electronic device defined in claim 5, wherein the first switch is configured to short the second terminal of the first switch to the third terminal of the first switch while the second switch shorts the first terminal of the second switch to the third terminal of the second switch.

15. The electronic device defined in claim 14, wherein the second switch is configured to short the second terminal of the second switch to the third terminal of the second switch while the first switch shorts the third terminal of the first switch to the first terminal of the first switch.

16. The electronic device defined in claim 2, wherein the processor comprises a baseband processor, the electronic device further comprising:
an additional receiver in the wireless radio-frequency transceiver circuitry;
a duplexer having a first terminal coupled to the antenna and having second and third terminals; and
an adjustable switch having a first input coupled to the tapped signal path, a second input coupled to the second terminal of the duplexer, and an output coupled to the additional receiver, wherein the adjustable switch is controlled using a control signal to selectively couple one of the duplexer and the tapped signal path to the additional receiver.

17. The electronic device defined in claim 16, further comprising:
a transmitter in the wireless radio-frequency transceiver circuitry;
an amplifier interposed between the transmitter and the third terminal of the duplexer; and
additional switching circuitry coupled between the first terminal of the duplexer and the antenna, wherein the coupler is interposed between the additional switching circuitry and the duplexer.

18. The electronic device defined in claim 17, further comprising:
an additional antenna; and
a third receiver in the wireless radio-frequency transceiver circuitry, wherein the additional switching circuitry has first, second, third, and fourth terminals, the first terminal of the additional switching circuitry is coupled to the first terminal of the duplexer through the coupler, the second terminal of the additional switching circuitry is coupled to the third transceiver, the third terminal of the additional switching circuitry is coupled to the antenna, and the fourth terminal of the additional switching circuitry is coupled to the additional antenna.

19. The electronic device defined in claim 2, wherein the antenna comprises antenna tuning circuitry, and the processor is configured to:
reduce the transmit power level in response to identifying, in the S-parameter phase and magnitude information, a first amount of magnitude mismatch and a first amount of phase mismatch between the tapped version of the reflected transmitted radio-frequency signals and the tapped radio-frequency signals transmitted by the wireless radio-frequency transceiver circuitry; and
reduce the transmit power level and adjust the antenna tuning circuitry in response to identifying, in the S-parameter phase and magnitude information, a second amount of magnitude mismatch and the first amount of phase mismatch between the tapped version of the reflected transmitted radio-frequency signals and the tapped radio-frequency signals transmitted by the wireless radio-frequency transceiver circuitry, wherein the second amount of magnitude mismatch is greater than the first amount of magnitude mismatch.

\* \* \* \* \*